(12) United States Patent
Hacke et al.

(10) Patent No.: US 6,818,090 B2
(45) Date of Patent: Nov. 16, 2004

(54) SEMICONDUCTOR DEVICE IN CHIP FORMAT AND METHOD FOR PRODUCING IT

(75) Inventors: Hans-Jürgen Hacke, München (DE); Klaus-Peter Galuschki, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/761,594

(22) Filed: Jan. 16, 2001

(65) Prior Publication Data

US 2001/0011675 A1 Aug. 9, 2001

Related U.S. Application Data

(63) Continuation of application No. PCT/DE99/02118, filed on Jul. 6, 1999.

(30) Foreign Application Priority Data

Jul. 14, 1998 (DE) .......................................... 198 32 706

(51) Int. Cl.$^7$ ............................................. H01L 23/538
(52) U.S. Cl. ........................ 156/297; 29/842; 257/738; 438/119
(58) Field of Search ............................ 159/297; 29/832, 29/842, 739, 740, 741; 257/737, 738; 438/119

(56) References Cited

U.S. PATENT DOCUMENTS

| | | | |
|---|---|---|---|
| 4,922,321 A | | 5/1990 | Arai et al. |
| 5,074,947 A | | 12/1991 | Estes et al. |
| 5,340,775 A | | 8/1994 | Carruthers et al. |
| 5,477,087 A | | 12/1995 | Kawakita et al. |
| 5,663,086 A | | 9/1997 | Rostoker et al. |
| 5,672,542 A | | 9/1997 | Schwiebert et al. |
| 5,929,522 A | * | 7/1999 | Weber ........................ 257/693 |
| 6,107,109 A | * | 8/2000 | Akram et al. ................ 438/15 |
| 6,114,240 A | * | 9/2000 | Akram et al. ................ 438/666 |
| 6,180,504 B1 | * | 1/2001 | Farnworth et al. .......... 257/668 |
| 6,297,559 B1 | * | 10/2001 | Call et al. .............. 228/180.22 |
| 6,369,600 B2 | * | 4/2002 | Farnworth et al. .......... 324/755 |

FOREIGN PATENT DOCUMENTS

| | | |
|---|---|---|
| EP | 0 734 059 A2 | 9/1996 |
| JP | 61 177 746 | 8/1986 |
| JP | 05 062 981 | 3/1993 |
| JP | 06 232 134 | 8/1994 |

OTHER PUBLICATIONS

International Publication WO 96/22620 (Pedersen et al.), dated Jul. 25, 1996.

(List continued on next page.)

Primary Examiner—Jeff H. Aftergut
Assistant Examiner—John T. Haran
(74) Attorney, Agent, or Firm—Laurence A. Greenberg; Werner H. Stemer; Ralph E. Locher

(57) ABSTRACT

A semiconductor device in chip format having a chip which has at least one first insulating layer and electrical connection pads free of the insulating layer is described. On the first insulating layer, interconnects run from the electrical connection pads to base regions of external connection elements. A further applied insulating layer is provided with openings leading from the outside to the base regions of the external connection elements. In the openings there is a conductive adhesive, onto which small balls which are metallic at least on the outside are placed. The semiconductor element can also contain a solder paste instead of a conductive adhesive in the openings, and metallized small plastic balls are placed onto the solder paste. The invention furthermore relates to methods for producing the semiconductor device described.

15 Claims, 2 Drawing Sheets

OTHER PUBLICATIONS

Shinji Baba et al.: "Molded Chip Scale package for High Pin Count", 1996 Electronic Components and Technology Conference, pp. 1251–1257, XP–000684987.

"Solder Plated Resin Ball", IBM Technical Disclosure Bulletin, pp. 463–464.

John R. Morris et al.: "Stencil Printing of Solder Paste for Fine–Pitch Surface Mount Assembly", *IEEE Transactions on Components, Hybrids, and Manufacturing Technology*, vol. 14, Sep. 1991, No. 3, pp. 560–566.

P. Van Zant: "Microchip Fabrication" Chapter 7, McGraw Hill, New York, 1998, pp. 139–146, 598–599.

* cited by examiner

SEMICONDUCTOR DEVICE IN CHIP FORMAT AND METHOD FOR PRODUCING IT

CROSS-REFERENCE TO RELATED APPLICATION

This is a continuation of copending International Application PCT/DE99/02118, filed Jul. 6, 1999, which designated the United States.

BACKGROUND OF THE INVENTION

Field of the Invention

Published European Patent Application EP 0 734 059 A2 discloses a so-called chip-size semiconductor device, that is to say a semiconductor device in chip format, which is distinguished by the fact that its areal dimensions essentially corresponds to those of the chip, and it is larger than the chip only in terms of height. In the known semiconductor device, the external connections are fitted above the surface of the actual chip by the chip having on a surface, in addition to a passivation layer, a first insulating layer and electrical connection pads free of the insulating layers. The electronics disposed within the chip are electrically connected to the electrical connection pads. Interconnects which proceed from the electrical connection pads and end at base points of external connection elements run on the first insulating layer. In the known semiconductor device, the external connection elements are formed in each case by a solder ball which extends through an opening in a further insulating layer as far as the interconnect, where it has its base point. In this case, the external connection elements in the form of the solder balls are disposed in a manner corresponding to the grid of soldering points on a printed circuit board. The known semiconductor device can therefore be applied to a printed circuit board in a straightforward manner by soldering.

SUMMARY OF INVENTION

It is accordingly an object of the invention to provide a semiconductor device in chip format and a method for producing it that overcome the above-mentioned disadvantages of the prior art devices and methods of this general type, that enables comparatively good mechanical decoupling from a printed circuit board when the semiconductor component is soldered onto the printed circuit board.

With the foregoing and other objects in view there is provided, in accordance with the invention, a semiconductor device in chip format. The device is formed of a chip, electrical connection pads disposed on the chip, and at least one first insulating layer disposed on the chip such that the electrical connection pads are free of the first insulating layer on at least one surface. Interconnects run on the first insulating layer and in each case lead from the electrical connection pads to base regions. A second insulating layer is disposed on the interconnects and on the first insulating layer. The second insulating layer is thicker than the first insulating layer. The second insulating layer has openings formed therein and each of the openings leads to a respective one of the base regions. Cylinders made of a cured, elastic conductive adhesive material are disposed in each of the openings. Small plastic balls having a metallic coating on an outside are disposed in each case on a respective one of the cylinders made of the cured, elastic conductive adhesive material in a region of a free end of each of the openings.

In accordance with an added feature of the invention, the second insulating layer is at least four times thicker than the first insulating layer.

An essential advantage of the semiconductor device according to the invention results from the conductive adhesive introduced into the openings in the second insulating layer. Such a conductive adhesive has comparatively good elastic properties even after it has been cured, so that, for example as a result of heating of a composite formed from a printed circuit and the semiconductor device, with accompanying varying thermal stresses, the stresses are kept away from the connecting points between the semiconductor device and the printed circuit board. Additionally, the cured conductive adhesive has a comparatively good aging behavior under mechanical alternating load.

In an advantageous refinement of the semiconductor device according to the invention, the second insulating layer is made considerably thicker than the at least one first insulating layer. This affords the advantageous possibility of filling a relatively large amount of conductive adhesive into the opening. As a result of which, after curing, relatively long cylinders are formed from the conductive adhesive material, which advantageously contribute to the good mechanical decoupling from a printed circuit board connected to the semiconductor device by soldering.

In a particularly advantageous embodiment of the semiconductor device according to the invention, the small balls that are metallic at least on the outside are metallized small plastic balls. Small balls of this type are distinguished by high elasticity, so that they make quite a substantial contribution to the mechanical decoupling of the semiconductor device from a printed circuit board populated with the semiconductor device. From U.S. Pat. No. 5,477,087 it is known per se to use connection elements having a plastic core with a metal coating in order to connect semiconductor devices to printed circuit boards. However, these connection elements are connected to the connection pad of the chip by a metal layer.

Another way of achieving the object specified above consists, according to the invention, in a semiconductor device in chip format having a chip which has, on at least one surface, at least one first insulating layer and electrical connection pads free of the insulating layer. The chip is furthermore provided with interconnects running on the first insulating layer. The interconnects in each case lead from the electrical connection pads to base regions of external connection elements, with a second insulating layer situated on the interconnects and on the at least one first insulating layer. The second insulating layer has, above the respective base region, an opening with introduced solder paste, and with metallized small plastic balls which are in each case placed onto the solder paste in the region of the free end of the via openings.

This embodiment is also distinguished by good mechanical decoupling properties between a printed circuit board and the soldered-on semiconductor device according to the invention, which can be attributed to the use of the metallized small plastic balls. This is because the small plastic balls have comparatively good elastic properties and therefore absorb the mechanical stresses between the printed circuit board and the semiconductor element.

In this embodiment, too, it is regarded as advantageous if the second insulating layer is considerably thicker than the at least one insulating layer, because the remelted solder paste forms a comparatively long cylinder with the metallized small plastic ball at its end, which contributes to a good mechanical decoupling between printed circuit board and semiconductor device.

The invention is furthermore based on the object of specifying a method for producing a semiconductor device in chip format which can be used to produce, in a comparatively simple manner, semiconductor devices having good mechanical decoupling properties.

One way in which this object is achieved consists in a method in which at least one first insulating layer is applied to at least one surface of the chip, with electrical connection pads being left free. Interconnects leading to a respective base region of external connection elements are applied to the at least one first insulating layer. On the interconnects and on the at least one first insulating layer, provision is made of a second insulating layer with openings above the respective base region. A conductive adhesive is introduced into the openings, small plastic balls that are metallic at least on the outside are in each case placed onto the conductive adhesive in the region of the free end of the openings, and the conductive adhesive is cured.

An essential advantage of the method according to the invention is that it can be used to produce semiconductor devices with mechanical decoupling properties in a comparatively simple manner because the step of introducing a conductive adhesive into the openings in the second insulating layer and also the step of placing small balls which are metallic at least on the outside onto the conductive adhesive can be carried out comparatively simply in process engineering terms.

Another embodiment of the method according to the invention consists in a method in which at least one first insulating layer is applied to at least one surface of the chip, with electrical connection pads being left free. Interconnects leading to a respective base region of external connection elements are applied to the at least one first insulating layer. On the interconnects and on the at least one first insulating layer, provision is made of a second insulating layer with openings above the respective base region. Solder paste is introduced into the openings, small plastic balls which are metallized on the outside are in each case placed onto the solder paste in the region of the free end of the via openings, and the solder paste is remelted.

The methods according to the invention can be carried out particularly simply when the conductive adhesive or the solder paste is introduced into the openings using a doctor blade, because introduction by a doctor blade is a comparatively simple process step. However, the introduction of solder paste by a doctor blade is already known per se, as revealed in the published Japanese Patent Application 6-232134, which is dealt with in the documentation "Flip-Chip-Technology, Vol. VII-1995 Update Foreign Patents", published in International Interconnection Intelligence, page 256.

The method according to the invention can be carried out particularly advantageously when the method steps are carried out on a wafer, and after the curing of the conductive adhesive or the remelting of the solder paste, the wafer is divided to obtain the semiconductor devices.

This leads to a significant reduction of costs because the individual method steps are not carried out individually for each chip but rather, to an extent, in the chip composite constituted by a wafer.

Other features which are considered as characteristic for the invention are set forth in the appended claims.

Although the invention is illustrated and described herein as embodied in a semiconductor device in chip format and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
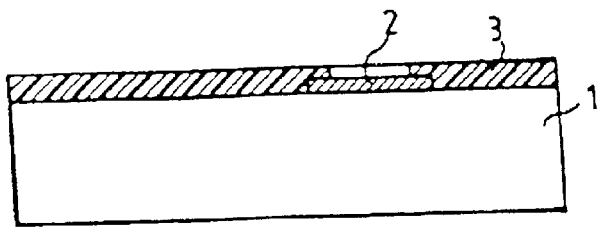
FIG. 1 is a diagrammatic, sectional view of a chip according to the invention.

In all the figures of the drawing, sub-features and integral parts that correspond to one another bear the same reference symbol in each case. Referring now to the figures of the drawing in detail and first, particularly, to FIG. 1 thereof, there is shown a chip 1, which is provided in a customary manner with electrical connection pads 2, often referred to as just pads. Of the many connection pads 2, just a single connection pad is illustrated in FIG. 1, for the sake of better clarity. A passivation layer 3 is applied to the chip 1 in a customary manner in such a way that it leaves the electrical connection pads 2 free.

Figure 2:
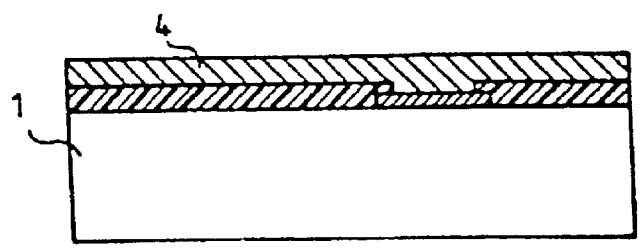
FIG. 2 is a sectional view of the chip.

The chip 1 prepared thus far has a metal layer 4 applied to it in a next method step, illustrated in FIG. 2. The application can be effected by thin-film metallization, if appropriate with subsequent reinforcement of the layer 4 by electro-deposition. The layer 4 may also be constructed as a multi-layer system. As can be seen in FIG. 2, the metal layer 4 is applied over the entire chip 1 on the top side thereof.

Figure 3:
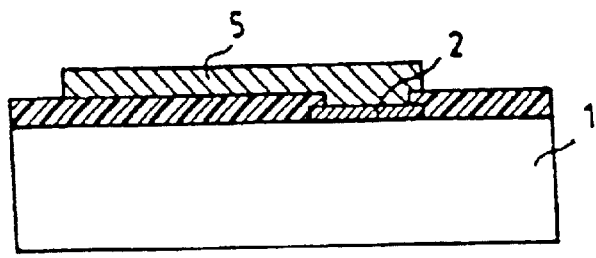
FIG. 3 is a sectional view of the chip.

Afterwards—as shown by FIG. 3—the metal layer 4 is patterned, thereby forming interconnects 5 which lead from the electrical connection pads 2 to base regions of external connection elements, which base regions will be described in more detail below.

Figure 4:
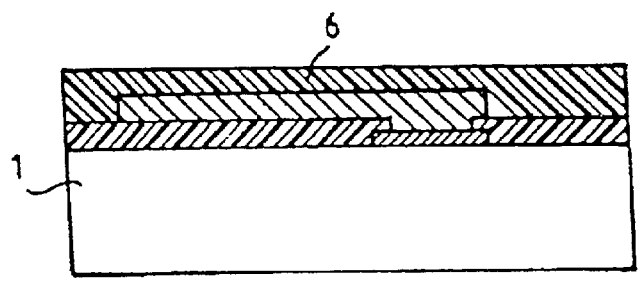
FIG. 4 is a sectional view of the chip.

FIG. 4 reveals that after the patterning of the metal layer 4 to form the interconnects 5, a further passivation layer 6 is applied to the chip 1. The further passivation layer 6 thus covers the interconnects 5 and also reinforces the protection afforded by the first passivation layer 3.

Figure 5:
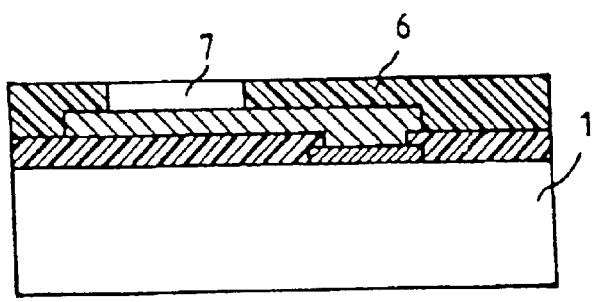
FIG. 5 is a sectional view of the chip.

FIG. 5 reveals that the further passivation layer 6 is then opened to form an opening 7, which can be done using phototechnology or by the application of a laser.

An insulating layer 8 is applied to the chip 1, or the further passivation layer 6, preferably by screen printing, spin-coating or lamination. The insulating layer 8 is considerably thicker than the passivation layer 3; together with the further passivation layer 6, it is about at least six times as thick as the passivation layer 3. This is clearly shown by FIG. 6, however, FIG. 6 is a diagrammatic representation and is not necessarily drawn to scale.

Figure 6:
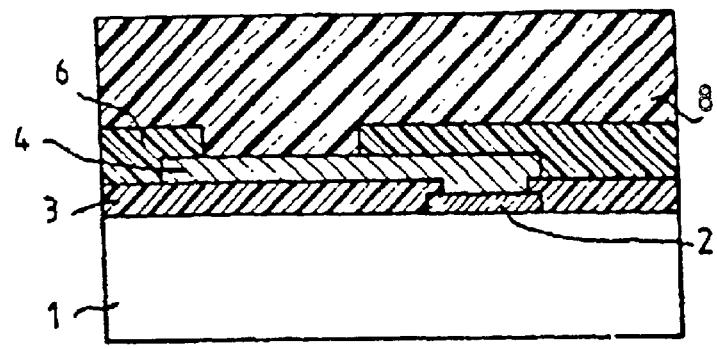
FIG. 6 is a sectional view of the chip.
Figure 7:
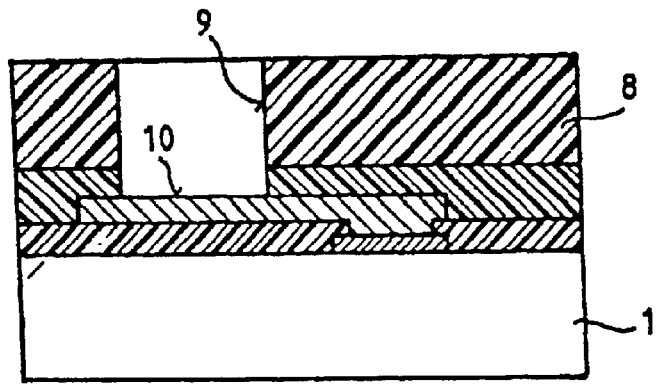
FIG. 7 is a sectional view of the chip.

FIG. 7 reveals that, after the method step illustrated by FIG. 6, the insulating layer 8 is opened to form a hole 9, so that it permits free access to a base region 10 of an external connection element that has not yet been formed. The step of opening the insulating layer 8 can once again be effected using phototechnology or by a laser. However, it is also possible to provide the opening 9 from the outset, by employing screen printing or a perforated film, so that an opening step is not necessary in that case.

It should be noted that the further passivation layer 6 and the insulating layer 8 can also be applied together, so that in that case, in a single method step, the opening 9 can be implemented by uncovering the single further insulating layer above the base region 10.

Figure 8:
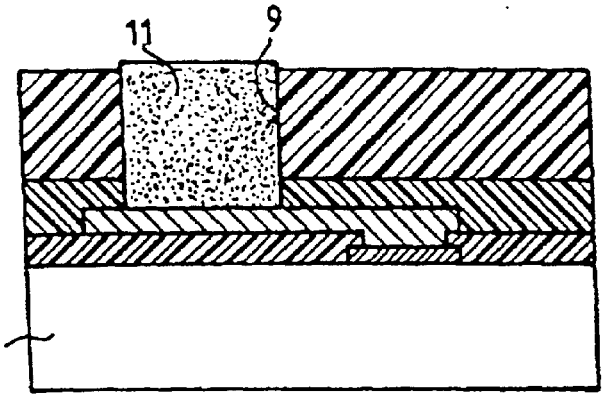
FIG. 8 is a sectional view of the chip.

Once the chip 1 has been prepared to the extent shown by FIG. 7, the opening 9 is filled with a conductive material 11, which may be a solder paste or a conductive adhesive (see FIG. 8). The conductive material 11 is preferably introduced by a doctor blade. In this case, the further insulating layer 8 may serve as a stencil.

Figure 9:
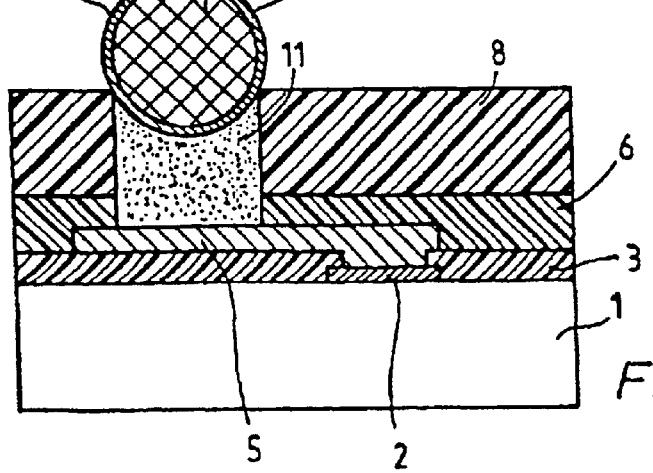
FIG. 9 is a sectional view of the chip.

Finally—as shown by FIG. 9—a ball 12 which is metallic at least on the outside is placed onto the conductive material 11 situated in the opening 9, and afterwards remelting is performed in the case where a solder paste is used, or curing is carried out in the case where a conductive adhesive is used. The small ball 12 which is metallized at least on the outside may be—as illustrated in FIG. 9—a small plastic ball which has an inner body 13 made of plastic which is coated with a metal layer 14 on the outside. The use of such small solder balls 12 is possible both when using solder paste and when using conductive adhesive.

In the case where a conductive adhesive is used, it is also possible to use small balls composed completely of metal. This is because sufficient elastic properties are provided by the conductive adhesive.

We claim:

1. A semiconductor device in chip format, comprising:
   a chip;
   electrical connection pads disposed on said chip;
   a first passivation layer disposed on said chip such that said electrical connection pads are free of said first passivation layer on at least one surface;
   interconnects running on said first passivation layer and in each case leading from said electrical connection pads to base regions;
   a second passivation layer disposed on said interconnects and on said first passivation layer, said second passivation layer having openings formed therein leading to said base regions;
   at least one insulating layer disposed on said interconnects and on said second passivation layer, said at least one insulating layer having a layer thickness, said at least one insulating layer having openings formed therein leading to said base regions;
   cylinders of a conductive material with an elasticity, disposed in each of said openings;
   small balls disposed on said cylinders of said conductive material in a region of a free end of each of said openings, said small balls having an elasticity and being metallic at least on an outside;
   said at least one insulating layer being at least four times thicker than said first passivation layer; and
   said thickness of said insulating layer, said elasticity of said conductive material, and said elasticity of said small balls being selected for obtaining a desired level of comparatively good mechanical decoupling from a printed circuit board upon the semiconductor component being soldered onto the printed circuit board.

2. The semiconductor device according to claim 1, wherein said conductive material is a solder paste which has been remelted after introduction into said opening.

3. The semiconductor device according to claim 1, wherein said conductive material is a conductive adhesive which has been cured after introduction into said opening.

4. The semiconductor device according to claim 3, wherein said small balls are composed completely of metal.

5. The semiconductor device according to claim 1, wherein said small balls are metallized plastic balls.

6. The semiconductor device according to claim 1, wherein said second passivation layer is thicker than said first passivation layer.

7. A method for producing semiconductor devices in a chip format, which comprises:
   providing chips;
   placing electrical connection pads on the chips;
   applying a first inzulating a first passivation layer to at least one surface of the chips such that the electrical connection pads are left at least partially uncovered by the first passivation layer;
   producing interconnects on the first passivation layer, the interconnects leading to base regions of external connection elements;
   applying a second passivation layer on the interconnects and on the first passivation layer;
   applying at least one insulating layer on the interconnects and on the second passivation layer, the at least one insulating layer having a thickness at least four times thicker than the first passivation layer;
   forming openings in the second passivation layer and the at least one insulating layer above the base regions and leading to the base regions;
   introducing cylinders of a conductive material with an elasticity into the openings;
   placing small balls onto the cylinders of the conductive material in a region of a free end of each of the openings, said small balls having an elasticity and being metallic at least on an outside; and
   selecting the thickness of the at least one insulating layer, the elasticity of the conductive material, and the elasticity of the small balls to obtain a desired level of comparatively good mechanical decoupling from a printed circuit board upon the semiconductor component being soldered onto the printed circuit board.

8. The method according to claim 7, which comprises using a doctor blade for introducing the conductive material into the openings.

9. The method according to claim 7, wherein the conductive material introduced into the opening is a solder paste which has been remelted after introduction into said opening.

10. The method according to claim 9, which comprises:
    forming the chips on a wafer; and
    after the remelting of the solder paste, dividing the wafer to obtain the semiconductor devices.

11. The method according to claim 7, wherein the conductive material introduced into the opening is a conductive adhesive which has been cured after introduction into the opening.

12. The method according to claim 11, which comprises forming the chips on a wafer; and
    after the curing of the conductive adhesive, dividing the wafer to obtain the semiconductor devices.

13. The method according to claim 11, wherein the small balls disposed on the conductive adhesive are composed completely of metal.

14. The method according to claim 7, wherein the small balls disposed on the conductive material are metallized plastic balls.

15. The method according to claim 7, wherein the applied second passivation layer is thicker than the applied first passivation layer.

* * * * *

UNITED STATES PATENT AND TRADEMARK OFFICE
CERTIFICATE OF CORRECTION

PATENT NO. : 6,818,090 B2
DATED : November 16, 2004
INVENTOR(S) : Hans-Jürgen Hacke et al.

It is certified that error appears in the above-identified patent and that said Letters Patent is hereby corrected as shown below:

Column 6,
Line 5, should read as follows: -- applying a first passivation layer to at --

Signed and Sealed this

Twenty-ninth Day of March, 2005

JON W. DUDAS
*Director of the United States Patent and Trademark Office*